United States Patent
Bordes et al.

(10) Patent No.: US 6,815,809 B2
(45) Date of Patent: Nov. 9, 2004

(54) PORTABLE ELECTRONIC DEVICE

(75) Inventors: Bente Adriaan Bordes, Eindhoven (NL); Cornelis Maria Hart, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/276,199

(22) PCT Filed: Mar. 14, 2002

(86) PCT No.: PCT/IB02/00781
§ 371 (c)(1),
(2), (4) Date: Nov. 12, 2002

(87) PCT Pub. No.: WO02/075647
PCT Pub. Date: Sep. 26, 2002

(65) Prior Publication Data
US 2003/0173657 A1 Sep. 18, 2003

(30) Foreign Application Priority Data
Mar. 16, 2001 (EP) .......................... 01200984

(51) Int. Cl.[7] .............................. H01L 23/02
(52) U.S. Cl. ....................... 257/679; 257/684
(58) Field of Search ................. 257/679, 684, 257/678, 492; 235/492

(56) References Cited

U.S. PATENT DOCUMENTS 5,854,480 A * 12/1998 Noto .......................... 235/492
6,011,690 A * 1/2000 Hughes et al. .............. 361/704

* cited by examiner

Primary Examiner—Phat X. Cao
(74) Attorney, Agent, or Firm—Kevin Simons

(57) ABSTRACT

The electronic device (10) comprises an integrated circuit (30) with a first (18) and a second side (19), on both sides (18, 19) of which first and second conductive areas (31, 32) are present. The electronic device (10) further has a first (64) and a second (65) conductive structure, which (64, 65) are present on a—preferably enveloping—layer (71) of dielectric material. Signal and power to and from the integrated circuit (30) are transferred through capacitors (11, 12) formed by the conductive areas (31, 32) and the conductive structures (64, 65) and an intermediate layer (73, 74) of dielectric material. The integrated circuit (30) may contain a protective layer (33) in the second conductive area (32).

14 Claims, 2 Drawing Sheets

PORTABLE ELECTRONIC DEVICE

This Application is a 371 of PCT/IB02/00781 filed Mar. 14, 2002

The invention relates to a portable electronic device, substantially in the form of a card, provided with an integrated circuit which has a first side and an opposite second side, comprising on the first side a first electrically conductive face and on the second side a second electrically conductive face, the device further comprising a first and a second electrically conductive structure, the first structure being situated on the first side of the integrated circuit and the second structure being situated on the second side of the integrated circuit, data and energy being transferable to the integrated circuit from a base station via said structures and faces.

The invention also relates to an integrated circuit which has a first and an opposite second side, on the first side having a substrate with a first electrically conductive face and on the second side a second electrically conductive face, the faces being suitable for transferring data and energy.

The invention further relates to a method of manufacturing a portable electronic device substantially in the form of a card, which device comprises an integrated circuit with a first and a second side, the first side having a first electrically conductive face and the second side a second electrically conductive face and a carrier.

The invention further relates to a carrier.

Such an electronic device is known from NL9200885. The known device is a single-use chip card. The integrated circuit in the known device is arranged in a through-hole in a substrate. The electric faces of the circuit are electrically connected to the structures i.e. contact points for contact with a base station. The contact points are preferably arranged as thin pieces of metal foil on the surfaces on both sides of the substrate, which contact points are connected to the faces of the integrated circuit via electrically conductive glue.

A disadvantage of the known device is that it is highly vulnerable to variations of thickness of either the integrated circuit or the substrate. Such variations may cause the contact to the contact points—the first and second structures—to be lost, so that the device no longer functions. It is probably for this reason that the known device according to the state of the art is a disposable article which is suitable for single use.

Therefore, it is a first object of the invention to provide an electronic device of the type defined in the opening paragraph, which is much less vulnerable to variations of thickness of either the integrated circuit or the carrier and in which nevertheless there is proper contact between the integrated circuit and the first and second structures of the device.

It is a second object of the invention to provide an integrated circuit of the type defined in the opening paragraph, which may be applied in portable electronic devices irrespective of its thickness.

It is a third object of the invention to provide a method of the type defined in the opening paragraph with which a multitude of the electronic device according to the invention can be manufactured efficiently.

It is a fourth object of the invention to provide a carrier which may be used in the method according to the invention.

The first object is achieved in that the first structure and the first face together with an intermediate layer of dielectric material form a capacitor. Data and energy may be transferred in the device according to the invention from the first structure to the first face with the aid of capacitive coupling. The first face may be made sufficiently large to provide an acceptable transfer of data and energy. The first face preferably covers one side of the integrated circuit and has a face of the order of 0.1 to 0.5 $mm^2$. A favorable thickness of the intermediate layer of dielectric material is of the order of 1 $\mu$m to 1 mm. When there is a capacitive coupling between the first structure and a base station, the thickness is preferably of the order of 1 to 50 $\mu$m. This thickness further depends on the dielectric constant of the dielectric material. It then turns out that the current flowing through parasitic capacitors is small relative to the current flowing through the capacitor according to the invention. A parasitic capacitor is, for example, the capacitor that is formed by the first and second structures with the intermediate layers. Thanks to a favorable choice of patterns forming these structures, parasitic capacitors may further be avoided to a very large extent. The dielectric layer between the integrated circuit and the first structure then prevents the problems with a contact between the first structure and the first face. For example, it is not necessary for a through-hole to be present in the card to arrange the integrated circuit in. Neither is it desirable for the integrated circuit to slightly protrude from to the card. Furthermore, it is not necessary for the conductive structure to be situated on the outside of the card.

In an advantageous embodiment, the device according to the invention has between the second structure and the second face also a layer of dielectric material which together form a second capacitor. The presence of a second capacitor is advantageous for the isolation of the integrated circuit from moist and other external influences. This presence is furthermore advantageous in that the manufacturing of the device can be simplified; a means of attachment of the integrated circuit to the conductive structures may be provided on the conductive structures. It is then particularly advantageous for the conductive structures to be part of a single layer of conductive material which envelops the integrated circuit as part of a carrier. The means of attachment is preferably glue.

On the other hand, the integrated circuit may be connected on its second face to the second structure with the aid of a layer of electrically conductive glue. It is particularly favorable for a layer of—possibly electrically conductive—glue to be spread over substantially the whole second structure and/or the whole first structure. The glue provides a firm connection of the first side to the second side of the device. Moreover, the glue provides that the integrated circuit has a stable position, so that the capacitors function well. Such a stable position can obviously also be realized with different means such as, for example, a clamp, a through-hole in which the IC is situated or glue on the first and second faces of the IC. An advantage of glue on the first and/or second structure is, however, that this may be realized in a simple manner in vast amounts.

The coupling between the device according to the invention and the base station may take place both with an electric contact and in a contactless manner. Examples of contactless coupling are capacitive and inductive couplings. In case inductive coupling is applied, for example the first structure has a helical pattern in which capacitor electrodes are included at at least two locations. These capacitor electrodes form part of the first capacitor between the first structure and the integrated circuit and of a capacitor between the first structure and the second structure.

In an advantageous embodiment the first and second structures are covered on both sides by an enveloping layer of dielectric material which extends as an envelope on the first and second sides of the integrated circuit. The enveloping layer in this example of embodiment has the advantages of both large robustness and simple manufacture. As a result of the complete envelope there is a good protection of the device against the effects of moist, oxygen and other sources of corrosion or pollution. The enveloping layer is preferably flexible. This can be realized, for example, by making the enveloping layer of a polymer dielectric material.

In a further embodiment the first structure and the second structure form part of a layer of electrically conductive material and form the enveloping layer, the layer of electrically conductive material and the layer of glue together forming a carrier. An advantage of this embodiment is the simplicity of manufacture.

In an advantageous embodiment the transfer between base station and device is effected with a capacitive coupling. It is an advantage of the use of capacitive coupling that the first and second structures can be arranged as a thin metal foil. It is even more favorable when the first and second structures comprise electrically conductive particles which are dispersed in a matrix to be provided on the enveloping layer as a liquid. Such a liquid may be disposed on the enveloping layer with the aid of known print and coating techniques. This reduces cost and thickness of the device and simplifies the manufacture of the device. Experiments have shown that despite the presence of two capacitors connected in series between the base station and the integrated circuit, the transfer of data and energy may be sufficient for making the device function.

The second object of the invention to provide an integrated circuit of the type defined in the opening paragraph which may be used in portable electronic devices irrespective of its thickness is achieved in that the second electrically conductive face is covered by a protective layer of dielectric material. The integrated circuit according to the invention is suitable for application in portable devices in which a connection between the integrated circuit and a transferring and/or receiving structure is realized with the aid of capacitive coupling. Such devices comprise the electronic device according to the invention and an information carrier such as a CD or a DVD disc. Such an information carrier is described in non-prepublished European application having application number EP 00203298.5 (PHNL000525). The protective layer thickness may be adjusted as desired. Dielectric materials are known to the expert. A choice from such materials may be made based on various properties such as deposition method, permeability to oxygen and moist, dielectric constant and temperature dependence of the dielectric constant. Preferably a dielectric material is chosen that is hardly temperature dependent i.e. satisfies the so-termed NPO standard. The substrate of the device is preferably silicon. The first face may be arranged therein by doting. If the first face is connected as a conductive layer to the substrate, the first face is preferably covered by a protective layer. Such a protective layer may also be the substrate with the conductive face being integrated with a first layer of conductive material. Such a conductive layer having the first face may also contain an electrode structure. Consequently, it is not necessary, but preferable indeed, for the first face to extend over substantially the whole face on the first side of the integrated circuit. This also holds for the second face. If the integrated circuit is used for identification purposes, it preferably contains a memory and a circuit by which data from the memory can be modulated in a manner so that simultaneous transfer of data and energy is made possible. Such a circuit is known to the expert.

The third object of the invention is to provide a method of the type defined in the opening paragraph with which a multiplicity of the electronic device according to the invention and as described in claim 5 can be manufactured efficiently is achieved in that the method comprises the steps of:

positioning the integrated circuit on the layer of glue of the carrier so that the first face of the integrated circuit and the part of the first structure of the layer of electrically conductive material are electrically connected to each other or, together with an intermediate layer of dielectric material, form a capacitor; and folding the carrier, while the second face of the integrated circuit and the part of the second structure of the layer of electrically conductive material are electrically connected to each other or together with an intermediate layer of dielectric material form a capacitor.

With the method according to the invention an electronic device according to the invention is made from a carrier and an integrated circuit in a small number of steps. Via a suitable separation method it is possible not only to realize the device as claimed in claim 5 with an enveloping carrier but also another device as claimed in claim 1. The method particularly does not need a patterning step. The carrier used can be manufactured on a very large scale. The patterning of the layer of electrically conductive material may be effected in various ways, such as deposition by a mask, coating and etching with the aid of photolithography and printing.

The method according to the invention then has a number of advantages. Firstly the carrier can be supplied on a reel, enabling a reel-to-reel process. For a reel to run adequately it is to be preferred that perforations are provided on two opposite sides of the reel. Such perforations are furthermore advantageous when the carrier is folded. The advantage may be a simple possibility of verifying whether the folding has taken place along the desired line on the carrier. The advantage may also be a handy manner of folding.

It is advantageous when a layer of glue is chosen that irreversibly bonds in contact with a further layer of glue and which bonds in a non-irreversible manner when in contact with another layer. Such layers of glue are commercially available. The advantage of such a layer of glue is that the glue need not have a foil top prior to use. Removing such a foil is an additional step. Especially in combination with the use of a reel the removing of the foil may be impractical.

A second advantage is that the positioning of the integrated circuit need not take place with a component positioning machine which components can be positioned with an accuracy of the order of dozens of micrometers. An accuracy of the order of millimeters is sufficient in the device according to the invention. Moreover, the component need not be pressed down on a layer of hot solder by the positioning machine. In fact it is sufficient for the positioning machine to release the integrated circuit from a distance of approximately several millimeters. For it is irrelevant whether the first or the second face lands on the carrier. When the integrated circuit has a thickness that is small relative to the surface of the first and the second face, there is no risk of the integrated circuit being positioned with one side face substantially perpendicular to the first and second face on the carrier. A machine which is more cost-efficient (and works faster) may thus be used. Such a positioning machine is known, for example, for filling blister packagings.

Preferably a layer of dielectric material is present on the carrier between the layer of electrically conductive material and the layer of glue. This is advantageous in that, when folding, no additional layer of dielectric material needs to be added. Moreover, this layer protects the layer of electrically conductive material. This layer of electrically conductive material is preferably deposited on the enveloping layer of dielectric material as a liquid in which electrically conductive particles are dispersed.

The portable electronic devices are preferably formed by separating them after the folding of the carrier. On the other hand, the portable devices may be wound on a reel and first be separated by a user. In that case it is advantageous when perforations are provided between the devices to simplify separation and to indicate the line along which separation is to take place. Such perforations may be provided when the carrier is manufactured.

The fourth object of the invention to provide a carrier which can be used in the method according to the invention is achieved in that the carrier contains a first layer of dielectric material;
a second layer of electrically conductive material, which layer has a first and a second structure found back in a number of units, parts of which structures having a substantial overlap in case of projection on the first layer of dielectric material after the carrier has been folded, and
a third layer of glue.
This carrier is pre-eminently suitable for use in the method according to the invention. The carrier preferably has perforated edges on both sides. It is further possible for perforations to be found between the units in a line substantially perpendicular to the perforated edges. The first and the second structure are chosen such that at the location of said parts there is only overlap between the first and the second structure when projection takes place on the layer of dielectric material. Said parts each form an electrode of a capacitor after the device has been manufactured. This capacitor further comprises a face on the integrated circuit and an intermediate dielectric layer or a connecting face for the integrated circuit. The layer of glue is preferably irreversibly bonding to a second layer of glue in this case the same layer of glue and detachably bonding to another layer. On the side of the first layer which is not in contact with the second layer, an additional layer may be provided in the form of a readable pattern. One may think of information for the user, a commercial or a name of a firm. The readable pattern may be directly printed on the first layer but also be present as a pattern on another layer possibly provided with glue.

These and other aspects of the invention are apparent from and will be elucidated, by way of non-limitative example, with reference to the embodiment(s) described hereinafter.

Figure 1:
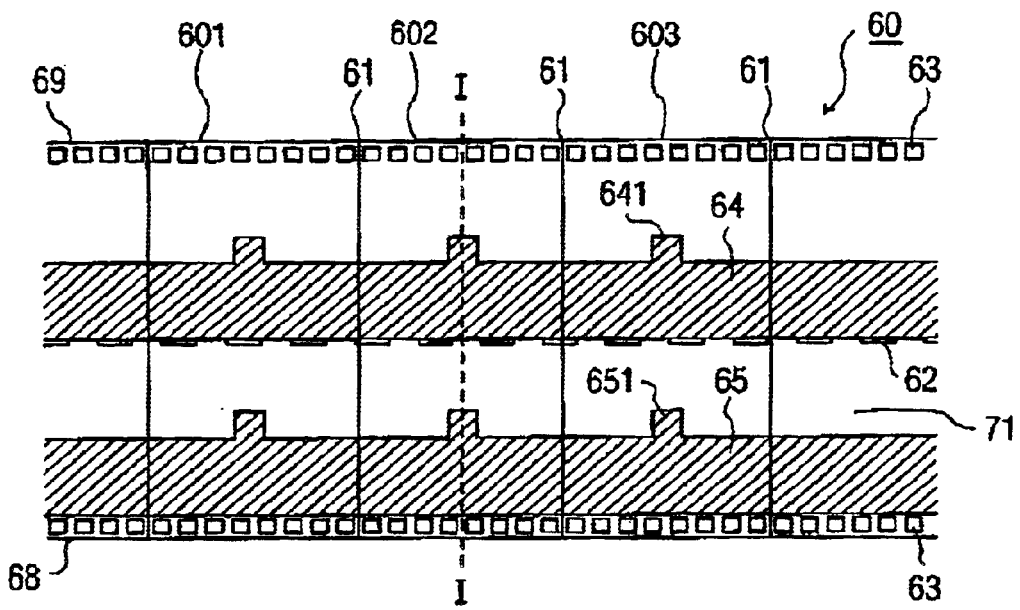
FIG. 1 shows a diagrammatic plan view of the carrier.

FIG. 1 shows a plan view of part of the carrier 60 according to the invention. The part comprises a number of units 601, 602, 603 which may be separated by intermediate section lines 61 into electronic devices 10 according to the invention. Prior to the separation an integrated circuit 30—not shown in FIG. 1—is arranged on each of the units 601, 602, 603 of the carrier 60. Furthermore, the carrier 60 is folded along the folding line 62 which forms an approximately 90 degree angle to the section lines 61. The carrier 60 comprises a first layer 71 of dielectric material, for example, polyimide or polyethylene. This layer 71 acts as a substrate of the carrier 60 and, after the carrier 60 is folded, forms an enveloping layer. The first layer 71 has perforations 63. The first layer has a first structure 64 and a second structure 65 of electrically conductive material. These structures 64, 65 contain each a part 641, 651, which parts 641, 651 are lying over each other after the carrier has been folded along the folding line 62, that is to say, when projected on the first layer 71, they overlap. The integrated circuit 30 is positioned on one of the parts 641, 651. After folding, a first and a second capacitor are developed, between part 641 and the integrated circuit 30 and between part 651 and the integrated circuit 30, respectively. Furthermore, a parasitic capacitor evolves whose parts 641 and 651 form the capacitor electrodes.

Except for the parts 641, 651, the first structure 64 and the second structure 65 further have no overlap after the carrier 60 has been folded. In this way parasitic capacitances are minimized. The structures 64, 65 each have dimensions of 4 by 5 cm. In this way these structures 64, 65 may be used for capacitive coupling of data and energy to a base station. The dimensions may be selected to be larger to realize a larger distance between the device 10 and the base station. With a supply voltage of 80 volts and a distance between the device 10 and the base station of approximately 1 cm, a current of 50 $\mu$A is obtained when a frequency of 125 kHz is used. The D.C. voltage in the device 10 is about 5 volts, which leads to a dissipation of 0.25 mW. When a frequency of 12.5 MHz is used, which is also possible, a 50 mA current is obtained and the dissipation is of the order of 25 mW. The device 10 can function very well with said values and in the range in between, without any problems of signal-to-noise ratio or heat dissipation. If the structures 64, 65 are realized in copper or another good heat conductor, problems need not be expected either with a current exceeding 50 mA. The optimization of the design of the device 10 is to a certain extent dependent on the selected frequency, as will be grasped by a man of ordinary skill in the art.

Figure 2:
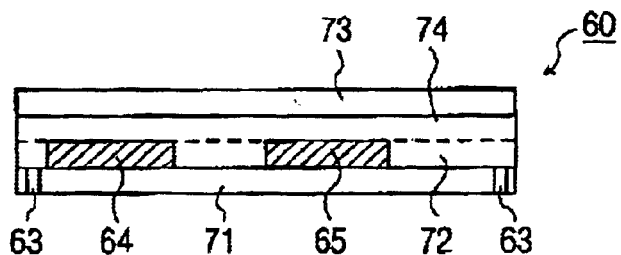
FIG. 2 shows a diagrammatic cross-section of the carrier along line I—I in FIG. 1.

FIG. 2 shows a cross-section of the carrier 60 along line I—I. The carrier 60 comprises a first layer 71 of dielectric material, a second layer 72 of electrically conductive material and a third layer 73 of glue. A further layer 74 of dielectric material is present between the second layer 72 and the third layer 73.

Figure 3:
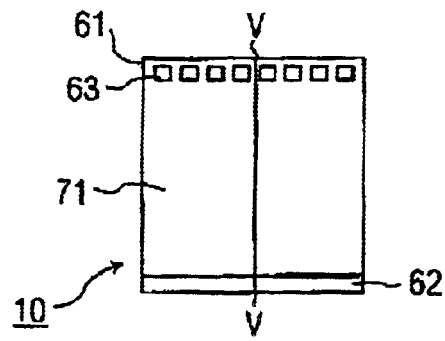
FIG. 3 shows a plan view of a first embodiment of the device.

FIG. 3 shows a plan view of the device 10 according to the invention. The device 10 is made in accordance with the method according to the invention from the carrier 60 and therefore has still perforations 63 on a pair of opposite sides 68, 69. However, this is not at all necessary. The perforations 63 are preferably removed before the device 10 is going to be used. The device may also be manufactured in a different way, for example, by assembling an underside and a top side.

Figure 4:
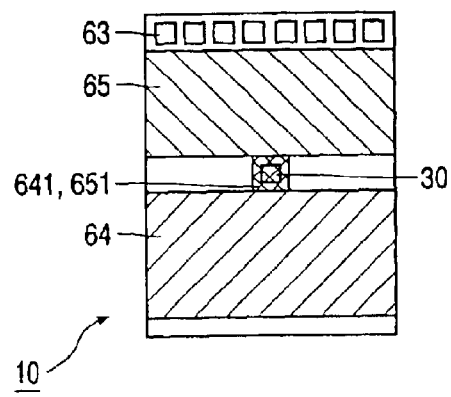
FIG. 4 shows a plan view as shown in FIG. 3 in which the enveloping layer and other isolation layers are depicted transparently.

FIG. 4 shows a plan view of the device 10 as shown in FIG. 3. In this Figure the enveloping layer 71 and other isolation layers are shown transparently; the first structure 64 is hatched, the hatching inclining forward; the second structure 65 is also shown hatched but inclining backward. It may be observed that the parts 641 and 651 are overlapping while the integrated circuit 30 is located in between the parts.

Figure 5:
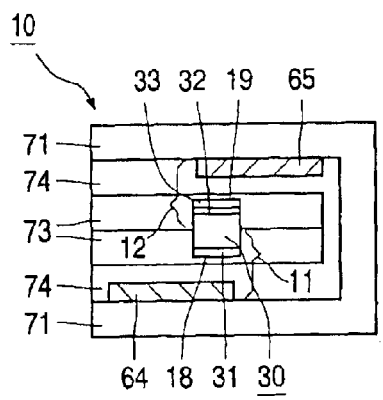
FIG. 5 is a diagrammatic cross-section of the device along line V—V in FIG. 3.

FIG. 5 shows a cross-section of the device 10 along line V—V in FIG. 3. The device comprises an enveloping layer 71, the electrically conductive structures 64, 65, the further isolation layer 74, the layer of glue 73 and the integrated circuit 30. The integrated circuit 30 has a first side 18 and an opposite side, second side 19, with on the first side 18 a substrate having a first electrically conductive face 31 and on the second side 19 a second electrically conductive face 32. A protective layer 33 of dielectric material such as, for example $SiN_x$ is disposed on the second face 32. The first face 31 is integrated with the substrate by implanting the substrate through a doping in known manner. The first face 31 and the first structure 64 together with the intermediate layers 73, 74 form the first capacitor 11. The second face 32 and the second structure 65 together with the internal layers 73, 74 form the second capacitor 12. The functioning of the electronic device 10 is further known from WO-A-99/30432.

To maximize the possible distance between the base station and the device 10 while dimensions of the structures 64, 65 are kept the same, the capacitors 11, 12 preferably have a capacitance that is substantial relative to the capacitance of the capacitors formed by the conductive structures 64, 65 and capacitor electrodes of the base station, it is to say, equally large or with further preference at least twice as large.

The distance, for example, between the base station and the device 10 is set at 1.0 cm. The first and second faces 31, 32 each have a surface of 0.25 mm$^2$, for example. The first and second structures for example each have a surface of 20 cm$^2$. When in that case a layer of glue 73 having a relative dielectric constant of 3 is used, this layer of glue 73 preferably has a thickness of 4 $\mu$m or less and further, preferably, a thickness of 2 $\mu$m or less. If otherwise a layer of glue 73 of electrically conductive glue is used and a protective layer 33 of SiN$^x$ is located on the second side of the integrated circuit 30, such a layer preferably has a thickness of less than 1.5 mm and with further preference less than 0.7 mm.

Figure 6:
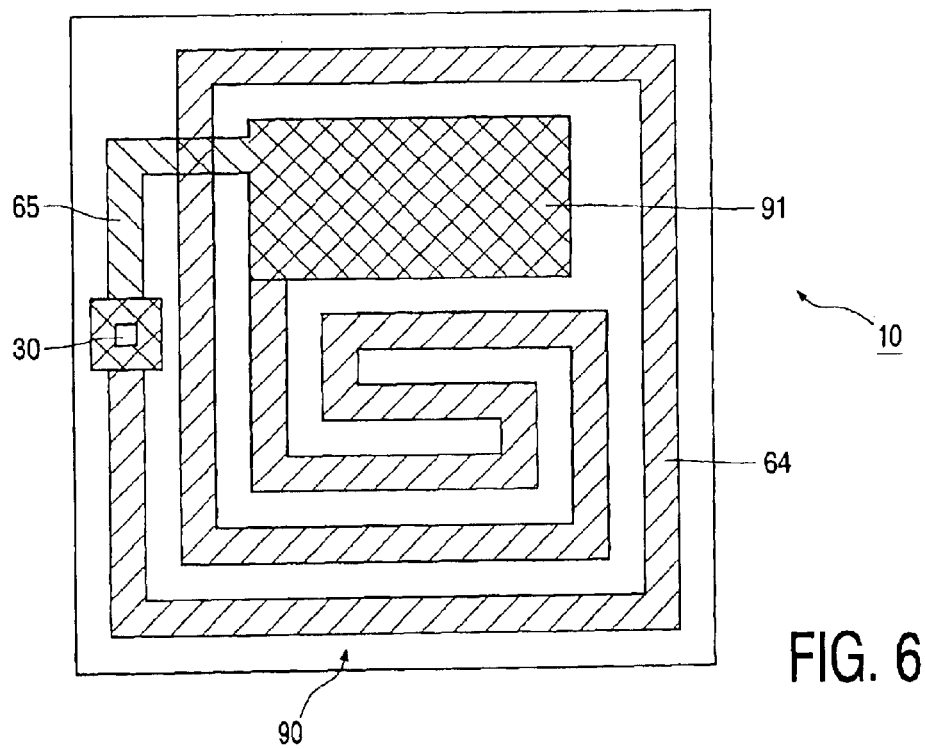
FIG. 6 is a plan view of a second embodiment of the device in which the enveloping layer and other isolation layers are depicted transparently.

FIG. 6 shows a different embodiment of the device 10 according to the invention. In this embodiment the first structure 64 of the structures 64, 65 is patterned substantially in the form of a coil 90. This first structure 64 is made of a material that has a good Q factor, for example, copper. The second structure 65 then has, in essence, the form of a capacitor plate 91 which is coupled to the first structure 64. In this embodiment the capacitance of the capacitors 11, 12 is not determined by the desired distance between the base station and the device 10, but by the current required in the integrated circuit. It is an advantage of this embodiment that a base station with an inductive coupling, as already available on the market, can be applied.

In short, the portable electronic device of the invention is provided with a first and second carrier layer and an integrated circuit which is provided between the first and the second carrier layer, which first and second carrier layers are provided with a first and second electrically conducting structure, respectively, for transfer of data and energy between a base station and the electronic device. In the electronic device, preferably a transponder or the like, the electrical connection between the integrated circuits and the electrically connecting structures is provided through capacitive coupling. This is embodied such that the dielectrical layer between the integrated circuit and structure or structures comprises glue, and that the integrated circuit comprises electrically conducting faces on opposite sides that act as capacitor electrodes. In a most preferred embodiment, the first and second carrier layers are part of the same enveloping carrier layer.

What is claimed is:

1. A portable electronic device comprising:
   an integrated circuit having:
     a first side with a first electrically conductive face, and
     an opposite second side with a second electrically conductive face,
   a first electrically conductive structure having:
     a first power-coupling area and a substantially smaller first IC-coupling area,
   a second electrically conductive structure having a second power-coupling area, wherein
   the first IC-coupling area is situated opposite to the first face to form a first IC-coupling capacitor,
   the first and second structures are located on a common substrate that is folded to envelope the integrated circuit.

2. The device of claim 1, wherein
   the first power-coupling area does not overlap the second power-coupling area when the common substrate is folded to envelope the integrated circuit, thereby minimizing parasitic capacitance between the first power-coupling area and the second power-coupling area.

3. The device of claim 2, wherein
   the first IC-coupling capacitor provides a first capacitance value that is substantially larger than the parasitic capacitance.

4. The device of claim 3, wherein:
   the second structure also includes a substantially smaller second IC-coupling area that is situated opposite to the second face to form a second IC-coupling capacitor.

5. The device of claim 4, wherein
   the second IC-coupling capacitor provides a second capacitance value that is substantially larger than the parasitic capacitance.

6. The device of claim 2, wherein:
   the second structure also includes a substantially smaller second IC-coupling area that is situated apposite to the second face to form a second IC-coupling capacitor.

7. The device of claim 6, wherein
   the second IC-coupling capacitor provides a second capacitance value that is substantially larger than the parasitic capacitance.

8. The device of claim 1, wherein
   at least one of the first and second power-coupling areas is sized to provide coupling to an external device that provides energy to the integrated circuit via this coupling.

9. The device of claim 8, wherein
   at least one of the first and second power-coupling areas is configured as a capacitor plate that couples the energy from the external device via capacitive coupling.

10. The device of claim 9, wherein
    a capacitance of the first IC-coupling capacitor is of a same order of magnitude as a capacitance value provided by the coupling or the capacitor plate and the external device.

11. The device of claim 9, wherein
    a capacitance of the first IC-coupling capacitor is greater than a capacitance value provided by the coupling of the capacitor plate and the external device.

12. The device of claim 8, wherein
    at least one of the first and second power-coupling areas is configured as a coil that couples the energy from the external device via inductive coupling.

13. The device of claim 1, wherein
    a layer of glue is provided between the first and second structures.

14. The device of claim 13, wherein
    the common substrate, the first and second structures, and the glue form an integral carrier for the integrated circuit.

* * * * *